Figure 1:
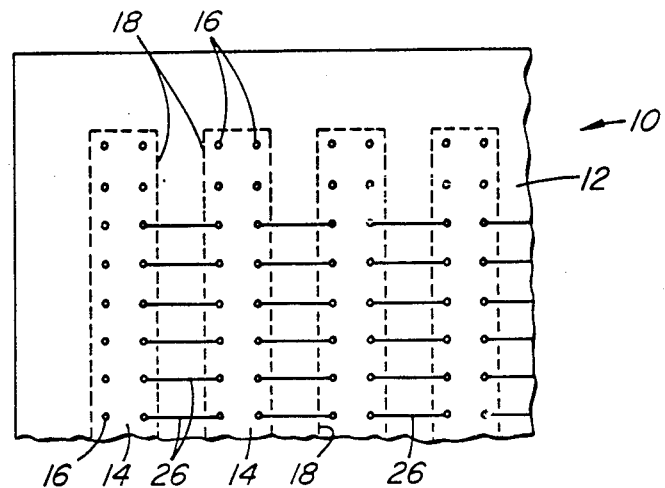

United States Patent [19]

Brombal et al.

[11] Patent Number: 4,575,780
[45] Date of Patent: Mar. 11, 1986

[54] BACKPANEL ASSEMBLIES

[75] Inventors: David S. Brombal, Kanata; Charles B. D. Bunner, Carp, both of Canada

[73] Assignee: Northern Telecom Limited, Montreal, Canada

[21] Appl. No.: 596,310

[22] Filed: Apr. 3, 1984

[51] Int. Cl.⁴ .............................................. H05K 1/14
[52] U.S. Cl. .................................... 361/413; 179/98; 361/412
[58] Field of Search ................ 361/412–414; 339/17 LM, 17 M, 17 L, 17 LC

[56] References Cited

U.S. PATENT DOCUMENTS

| | | | |
|---|---|---|---|
| 3,675,083 | 7/1972 | White | 361/413 |
| 3,755,630 | 8/1973 | Boyer | 179/98 |
| 3,800,097 | 3/1974 | Maruscak et al. | 179/98 |
| 3,963,301 | 6/1976 | Stark | 361/413 X |
| 4,307,438 | 12/1981 | Grubb | 361/412 X |
| 4,420,793 | 12/1983 | Strandberg | 361/413 |
| 4,472,765 | 9/1984 | Hughes | 361/413 |
| 4,488,354 | 12/1984 | Chan et al. | 361/412 X |

OTHER PUBLICATIONS

"Back-Panel Wiring" The Electronic Engineer, Jun. 72, p. 71, by Dick Hunter.

Primary Examiner—R. R. Kucia
Assistant Examiner—Tarick Basma
Attorney, Agent, or Firm—R. John Haley

[57] ABSTRACT

A backpanel assembly has printed circuit board (PCB) connectors aligned in parallel with one another and opposite one another on both sides of the backpanel, pins of opposite connectors passing through the backpanel. Each connector includes first and second groups of pins, conveniently in separate rows where each connector includes two rows of pins, which serve to provide a variable bus system between the connectors. To this end, pins of the first group of one PCB connector are connected via the backpanel to pins of the second group of an adjacent PCB connector on the same face of the backpanel. PCBs inserted into the connectors connect to the first group, but not the second group, of pins, except for bus extender PCBs which serve to interconnect the first and second groups of pins of a PCB connector and thereby extend the bus system across the connector. The arrangement is particularly well suited to apparatus using arbitrary numbers of processor and peripheral PCBs, which are inserted into connectors on opposite faces of the backpanel.

2 Claims, 3 Drawing Figures

BACKPANEL ASSEMBLIES

This invention relates to backpanel assemblies, and to electronic apparatus including such assemblies.

It is well known to provide electronic apparatus, such as telecommunications equipment, with a backpanel having a plurality of elongate printed circuit board (PCB) connectors aligned in parallel thereon, into which PCBs are inserted to carry out desired functions. This backpanel, which for example is itself a multi-layer PCB, provides desired interconnections between the PCBs, and enables the supply of signals and power thereto, via the PCB connectors.

The PCB connectors of a backpanel assembly are generally formed by pins extending from the backpanel and surrounded by a shroud which serves to protect the pins and to guide a mating connector on a PCB into engagement and electrical contact with the pins. Commonly each connector comprises two rows of pins. It is also known to provide pins which extend completely through the backpanel and project from each face thereof, the pins extending from each face of the backpanel being surrounded by a respective shroud to form a respective PCB connector, whereby the number of PCB connectors provided in the backpanel assembly is doubled. In this case the PCBs inserted into the connectors extend on both faces of the backpanel so that the backpanel is situated therebetween; however, the term "backpanel" is still used in this case.

In such apparatus it is desirable to facilitate expansion by arranging the backpanel so that the apparatus can initially operate with relatively few PCBs inserted, and can continue operation with greater capacity by inserting more PCBs into the backpanel connectors. Generally this means providing a bus system of interconnecting the PCB connectors on the backpanel, with correspondingly-positioned pins in many PCB connectors being connected together.

A problem arises, however, if different numbers and arrangements of PCBs of one type, for example processor boards, are required to be interconnected to varying numbers and arrangements of boards of other types, for example peripheral or interface boards, via respective busses which are different for the different processors.

For example, in an initial implementation of electronic apparatus it may be desired to have a single processor board and a few peripheral boards interconnected thereto via the backpanel. For greater capacity it may then be desired to add further peripheral boards, again interconnected to the single processor board via the backpanel. With greater numbers of peripheral boards, it may be desirable subsequently to provide one or more additional processor boards, each to operate independently of the other processor boards in association with a respective one or more peripheral boards via a respective set of interconnections. However, known backpanel assemblies do not conveniently allow for this.

Accordingly, an object of this invention is to provide an improved backpanel assembly, and electronic apparatus including such an assembly.

According to this invention there is provided a backpanel assembly comprising a backpanel having a plurality of elongate printed circuit board (PCB) connectors aligned in parallel on a first face thereof, each PCB connector including first and second groups of pins which extend from the PCB connector through the backpanel to form at least part of a connector on a second face of the backpanel, the first and second groups of pins having equal numbers of pins, the individual pins of the first and second groups of pins in adjacent PCB connectors on the first face of the backpanel being respectively interconnected via the backpanel.

The invention also extends to electronic apparatus comprising a backpanel assembly as recited above, a plurality of PCBs each inserted into a respective PCB connector and having electrical connections to pins of the first group but not to pins of the second group of the respective PCB connector, and connecting means connected to at least one connector on the second face of the backpanel, said connecting means electrically interconnecting individual pins of the first and second groups of pins of the respective connector, whereby the first groups of pins of adjacent PCB connectors on the first face of the backpanel are interconnected via the backpanel.

Thus the connecting means enables the first and second groups of pins of individual PCB connectors to be interconnected to complete a bus extending to adjacent PCB connectors, whereby busses across the backpanel may be formed and modified as desired for arbitrary interconnection of PCBs as the configuration of the apparatus is changed.

Conveniently each PCB connector comprises two rows of pins extending along its length, the first and second groups of pins comprise pins which are positioned adjacent one another in the respective rows, and the pins in the adjacent PCB connectors which are interconnected via the backpanel are interconnected via printed circuit backpanel wiring extending perpendicularly to the PCB connectors.

In a preferred embodiment of the invention, each connector on the second face of the backpanel comprises a PCB connector arranged opposite the respective PCB connector on the first face of the backpanel, connection pins of one connector extending through the backpanel to form connection pins of the opposite connector, whereby PCBs can be inserted into connectors on both faces of the backpanel.

A preferred form of electronic apparatus in accordance with the invention comprises a backpanel assembly as recited above and a plurality of PCBs inserted into respective PCB connectors on both faces of the backpanel, said PCBs comprising a plurality of PCBs each of which has electrical connections to pins of the first group but not to pins of the second group of the respective PCB connector into which it is inserted, and at least one PCB electrically interconnecting individual pins of the first and second groups of pins of the respective PCB connector into which it is inserted.

Figure 2:
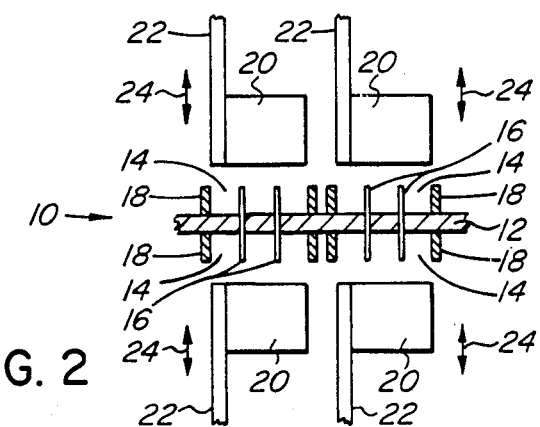
Figure 3:
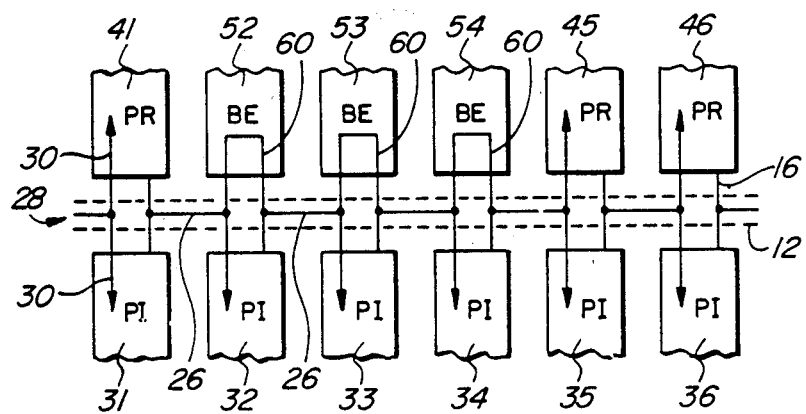

The invention will be further understood from the following description with reference to the accompanying drawings, in which:

FIG. 1 schematically illustrates part of a backpanel assembly;

FIG. 2 schematically illustrates the manner in which printed circuit boards (PCBs) are inserted into connectors on the backpanel assembly;

FIG. 3 schematically illustrates in a diagrammatic cross-sectional view electrical interconnections achieved between PCBs via the backpanel assembly.

Referring to the drawings, a backpanel assembly 10 is shown in part in FIG. 1 and in part in a cross-sectional view in FIG. 2. The backpanel assembly 10 comprises a backpanel 12, which is in the form of a multi-layer PCB, and a plurality of elongate PCB connectors 14 aligned in parallel thereon. Although the connectors 14 can be of other known forms, conveniently and as illustrated in FIGS. 1 and 2 each connector 14 consists of two rows of pins 16 surrounded by a shroud 18 (shown in broken lines in FIG. 1 for clarity) which serves to protect the pins 16 and to guide a connector 20 (FIG. 2) on each PCB 22 into engagement and electrical contact with the pins when the PCB 22 is inserted into the connector 14.

As illustrated in FIG. 2, the pins 16 extend completely through the backpanel 12 so as to project from each face thereof, and are surrounded by respective shrouds 18 to form respective PCB connectors 14 directly opposite one another on respective faces of the backpanel assembly 10. Accordingly, PCBs 22 can be inserted into connectors 14 on both sides of the backpanel assembly 10, as illustrated in FIG. 2 by arrows 24, the PCBs being guided into proper position for interengagement of the connectors 20 and 14 by means of guide rails (not shown) at edges of the PCBs, as is well known.

The backpanel assembly 10 is intended to accommodate at least two types of PCBs 22, which are referred to here as processor (PR) boards and peripheral or interface (PI) boards, in various numbers and arrangements. Interconnections between these boards are achieved in a manner which is described below with reference to FIGS. 1 and 3. In addition to the interconnections discussed specifically below, the boards may be interconnected among themselves, and may be connected to other apparatus, via the PCB connectors 14 and the backpanel 12 in any known manner, for example for the supply of power and signals commonly to the boards. As the known arrangements of such conventional connections form no part of this invention, they are not further described here. However, the presence of such other connections is indicated in FIG. 1 by the presence of four pins 16, at the top of each connector 14 as shown in FIG. 1, which together with other pins (not shown) may serve for such connections.

Referring to FIG. 1, the two rows of pins 16 of each connector 14, for specific interconnections between the PCBs 22, are divided into two equal groups. For convenience the left-hand row, as shown in the drawings, of pins 16 in each connector 14 forms one of these groups, and the right-hand row, as shown in the drawings, of pins 16 in each connector 14 forms the other group. However, any other division of the pins 16, with interconnections corresponding to those described below, may be provided.

As illustrated, each pin 16 of the right-hand row of pins of each connector 14 is connected to a correspondingly-positioned pin 16 of the left-hand row of pins of the connector 14 immediately to the right, by a respective printed circuit track 26 of the backpanel 12. The tracks 26 thus form segmented busses across the backpanel 12, each segment extending between correspondingly pins 16 on opposite sides of adjacent connectors 14. One such segmented bus 28 is diagramatically illustrated in FIG. 3, in which the backpanel 12 is indicated by broken lines for clarity, and one set of correspondingly-positioned pins 16 on the left-hand and right-hand sides of the connectors 14 is represented by electrical connecting lines also referenced 16.

All of the PR boards and all of the PI boards are arranged to be electrically connected via their connectors 20 with only one of the two equal groups of pins. In FIG. 3 it is assumed that this is the left-hand (as illustrated) row of pins. This selection is relatively arbitrary, but is consistent for all of the PR and PI boards. For convenience, as illustrated in FIG. 3 all of the PI boards are inserted into connectors on one face of the backpanel 12, and all of the PR boards are inserted into connectors on the opposite face of the backpanel. FIG. 3 illustrates six PI boards 31 to 36 and three PR boards 41, 45 and 46, and in addition illustrates three bus extender (BE) boards 52 to 54 which are described below. FIG. 3 illustrates clearly by connections represented by arrowed lines 30 that each PR and PI board is electrically connected to the left-hand pin, and not to the right-hand pin, of the respective connector.

Each of the BE boards comprises a PCB which is inserted into a connector 14 in place of a PR board and which contains electrical connections between the left-hand and right-hand groups of pins. Each such electrical connection serves to join together two adjacent segments or tracks 26 of the respective segmented bus, whereby the bus is extended between the segments aross the respective connector 14. FIG. 3 illustrates this for the one segmented bus 28 shown, electrical connections 60 on the BE cards 52 to 54 forming a continuous bus from the left-hand pins of the connectors for the boards 35 and 45 to the right-hand pins of the connectors for the boards 31 to 41. The other segmented busses are extended in the same manner.

From the above description and the drawings, it should be appreciated that the PR board 46 and the PI board 36 are interconnected via the left-hand pins of their respective connectors 14, but are not connected to other boards. The PR board 45 is connected in a similar manner to the PI board 35, and also the PI boards 34, 33, and 32 by virtue of the presence of the BE boards 54, 53, and 52 respectively. The PR board 41 and the PI board 31 are interconnected via the left-hand group of pins of their connectors 14, but are not connected to any of the boards to their right (as illustrated) because they do not connect to the right-hand group of pins of their connectors, and may or may not be connected to other boards to their left depending on the presence or absence of other BE boards (not shown).

Although in FIG. 3 boards are shown in all possible positions, this need not be the case. For example, the PI board 32 need not be present, and the corresponding BE board 52 may be consequently omitted or not as desired. Furthermore, any of the PI boards 32 to 35 may be removed without affecting the interconnections between the PR board 45 and the remaining ones of these PI boards.

Furthermore, it should now be appreciated that the arrangement described is particularly amenable to modification and expansion. For example, if it is determined that the functions of the PR board 41 can be handled by the PR board 45, then this can readily be achieved simply by replacing the PR board 41 with a BE board. Conversely, if it is determined that an additional PR board should be provided to share with the PR board 45 the handling of functions for the PI boards 32 to 35, such an additional PR board can be provided in place of one of the BE boards 52 to 54, depending on the sharing of functions which is desired, to achieve this.

Although a particular embodiment of the invention has been described, it should be appreciated that numerous modifications, variations, and adaptations may be made thereto without departing from the scope of the invention as defined in the claims. For example, as already observed the two groups of pins which are linked by the BE boards can be selected in any desired manner, and need not be in separate rows as in the embodiment described. In addition, the BE boards may be provided with logic or other circuitry (e.g. bus drivers) for effecting interconnections between the two groups of pins, and may optionally interconnect only some of the pins of the two groups, to suit particular requirements.

In addition, it is observed that the invention is applicable to equipment using other than the processor and peripheral or interface boards described above, and that other physical arrangements of the boards may be provided. For example, instead of having the PR and PI boards on opposite sides of the backpanel as described above, they could all be provided on the same side of the backpanel with BE boards on the opposite side as desired to extend the segmented busses between those adjacent PR and PI boards requiring interconnections. In this case it is observed that the BE boards could be reduced in size to the extent that they consist of mere plug-in jumpers between the pins requiring interconnection.

What is claimed is:

1. Electronic apparatus comprising:
   a backpanel assembly comprising a backpanel having a plurality of elongate printed circuit board (PCB) connectors aligned in parallel on a first face thereof, each PCB connector including first and second groups of pins which extend from the PCB connector through the backpanel to form at least part of a PCB connector on a second face of the backpanel, the first and second groups of pins having equal numbers of pins, the individual pins of the first and second groups of pins in adjacent PCB connectors on the first face of the backpanel being respectively interconnected via the backpanel;
   a plurality of PCBs each inserted into a respective PCB connector on one of the faces of the backpanel and having electrical connections to pins of the first group but not to pins of the second group of the respective PCB connector;
   at least one PCB inserted into a PCB connector on the other face of the backpanel opposite a respective one of said plurality of PCBs, said at least one PCB having electrical connections to pins of the first group but not to pins of the second group of the respective PCB connector; and
   at least one connecting means inserted into a PCB connector on said other face of the backpanel opposite a respective one of said plurality of PCBs, said connecting means electrically interconnecting individual pins of the first and second groups of pins of the respective connector.

2. Electronic apparatus as claimed in claim 1 wherein each PCB connector comprises two rows of pins extending along its length, the first and second groups of pins comprise pins which are positioned adjacent one another in the respective rows, and the pins in the adjacent PCB connectors which are interconnected via the backpanel are interconnected via printed circuit backpanel wiring extending perpendicularly to the PCB connectors.

* * * * *